(12) United States Patent
Polley

(10) Patent No.: US 8,710,904 B2
(45) Date of Patent: Apr. 29, 2014

(54) MOS RESISTOR APPARATUS AND METHODS

(71) Applicant: Texas Instruments Incorporated, Dallas, TX (US)

(72) Inventor: Arup Polley, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/728,959

(22) Filed: Dec. 27, 2012

(65) Prior Publication Data

US 2014/0049314 A1 Feb. 20, 2014

Related U.S. Application Data

(60) Provisional application No. 61/682,840, filed on Aug. 14, 2012.

(51) Int. Cl.
*G11C 5/14* (2006.01)

(52) U.S. Cl.
CPC .................................. *G11C 5/147* (2013.01)
USPC ......................................... 327/530; 327/378

(58) Field of Classification Search
USPC ......... 327/362, 378, 512, 513, 530, 534–538, 327/540, 541, 543
See application file for complete search history.

(56) References Cited

U.S. PATENT DOCUMENTS 6,703,682 B2 * 3/2004 Aswell .......................... 257/536

OTHER PUBLICATIONS

Keng Hoong Wee et al, "An Electronically Tunable Linear or Nonlinear MOS Resistor"; IEEE Transactions on Circuits and Systems, Oct. 2008, pp. 2573-2583 I: Regular Papers, vol. 55, No. 9.
Karthi Balasubramanian et al, "MOS Characteristics and a Modified Linear MOS Resistor"; TECHPOS (conference), 2009.
Peter Langlois et al, "Realization of a Simple High-Value Grounded Linear Resistance in CMOS Technology"; Proceedings of ESSCIRC 2005, pp. 383-386, Paper 7.E.3, Grenoble, France.

* cited by examiner

*Primary Examiner* — Lincoln Donovan
*Assistant Examiner* — Sibin Chen
(74) *Attorney, Agent, or Firm* — Alan A. R. Cooper; W. James Brady, III; Frederick J. Telecky, Jr.

(57) ABSTRACT

Apparatus and methods disclosed herein implement a MOS resistor using the current channel of a MOS transistor. The MOS resistance R(DS) is dependent upon MOS transistor geometry and nominal gate voltage. MOS resistor terminal-to-gate voltages are averaged and applied to the MOS transistor gate such as to maintain the MOS resistor terminal voltage to current ratio, resulting in a substantially constant R(DS). R(DS) is also compensated for temperature and process variations by adjusting gate voltages via negative feedback methods.

17 Claims, 5 Drawing Sheets

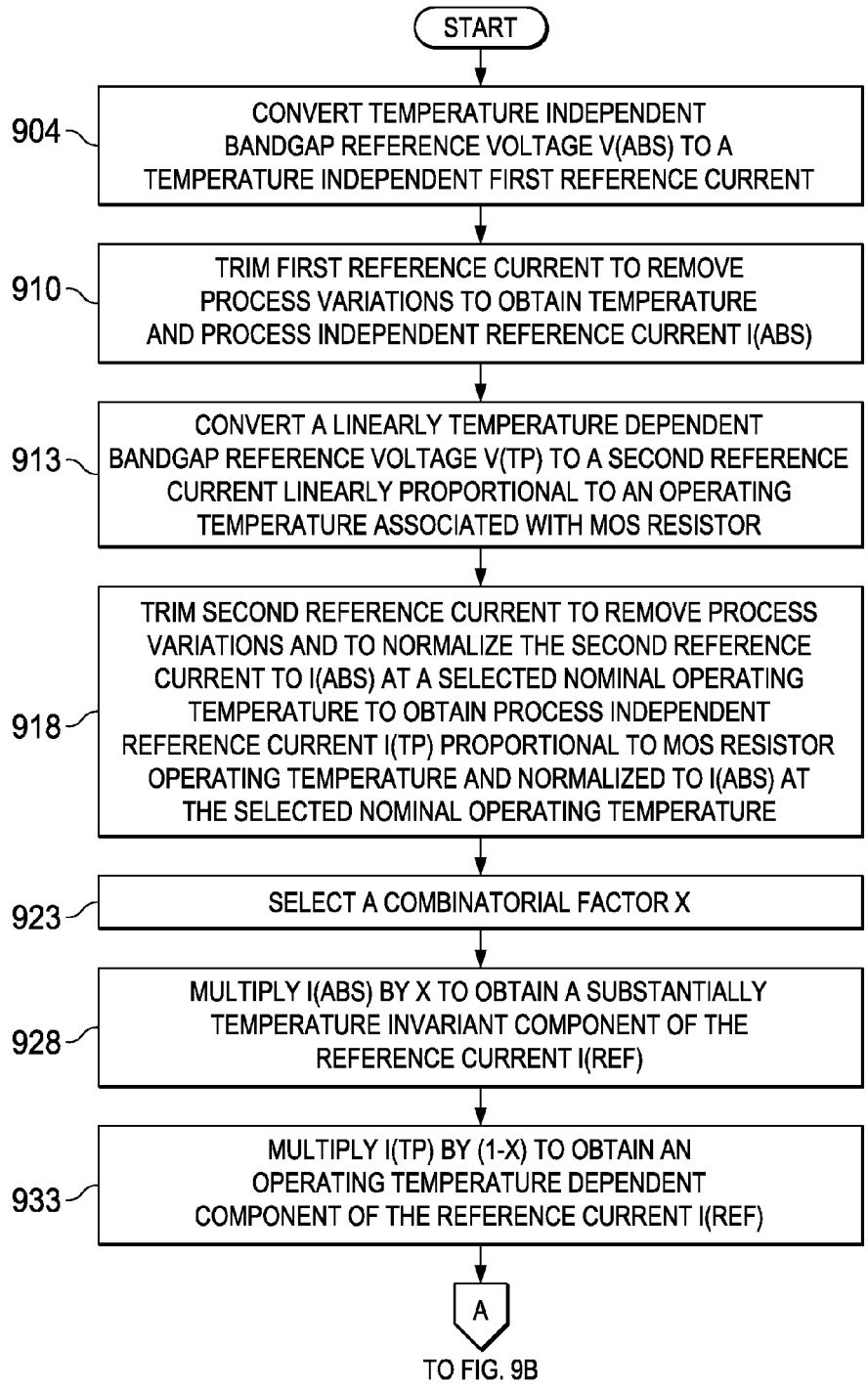

MOS RESISTOR APPARATUS AND METHODS

PRIORITY CLAIM

This application claims the benefit of priority under 35 U.S.C. §119(e) to U.S. Provisional Patent Application Ser. No. 61/682,840 titled "Large, Linear, PT-insensitive, Low-leakage MOS Resistor" filed on Aug. 14, 2012 and incorporated herein by reference in its entirety.

TECHNICAL FIELD

Structures and methods described herein relate to semiconductor integrated resistors, including resistors implemented with metal oxide semiconductor (MOS) transistors.

BACKGROUND INFORMATION

Some integrated electronic circuits may utilize electronic resistors for proper operation. For example, a circuit for measuring an electrical current may be simplified by measuring the voltage drop across a resistor through which the test current is flowing. The latter approach may prove more economical than methods of measuring the current directly. However, the accuracy of this approach is limited to the accuracy of the resistor, per Ohm's Law.

In one approach, a length of doped polysilicon may be deposited on a substrate and contacts made at the ends of the length to form a resistor. Such approach may be relatively temperature stable with a low process variation. However, large polysilicon resistors occupy a large wafer area and may thus be expensive to implement. For example, a polysilicon resistor of 50 meg ohms may occupy a surface area on the order of 100,000 µm squared.

Another approach to integrated resistor implementation is that of using a MOS transistor operating in the linear region. The relationship between current I(D) through the drain-to-source channel of a MOS transistor operating in the linear region and the voltage V(DS) across the channel is given by:

$$I(D) = k\frac{W}{L}[V(GS) - V(TH) - V(DS)/2]V(DS),$$

where k, W, and L are process and geometry dependent constants and V(TH) is the threshold voltage.

A resistance formed by the drain-to-source channel is thus represented as:

$$R(DS) = \frac{V(DS)}{I(D)}$$
$$= \frac{1}{k\frac{W}{L}[V(GS) - V(TH) - V(DS)/2]}$$

Unfortunately it can be seen that, for a given process and geometry, the resistance associated with a resistor formed using a MOS transistor operating in the linear region is not constant. The resistance of the MOS resistor so formed varies as a function of gate voltage and drain-to-source voltage.

BRIEF DESCRIPTION OF THE DRAWINGS

FIGS. 9A and 9B are a flow diagram illustrating a method of maintaining a substantially constant ratio of terminal voltage to current through a MOS resistor formed by at least one MOS transistor drain-to-source channel according to various activities.

SUMMARY OF THE INVENTION

Apparatus and methods disclosed herein implement a MOS resistor using the current channel of a MOS transistor operating in the linear region. The MOS resistance R(DS) is dependent upon MOS transistor geometry and nominal gate voltage. Gate-to-terminal voltages associated with each MOS resistor terminal are averaged and applied to the MOS transistor gate such as to maintain the ratio of terminal voltage to current through the MOS resistor. Doing so results in a substantially constant R(DS). R(DS) is also compensated for temperature and process variations by adjusting gate voltages via negative feedback structures and methods as further described below.

DETAILED DESCRIPTION

Figure 1:
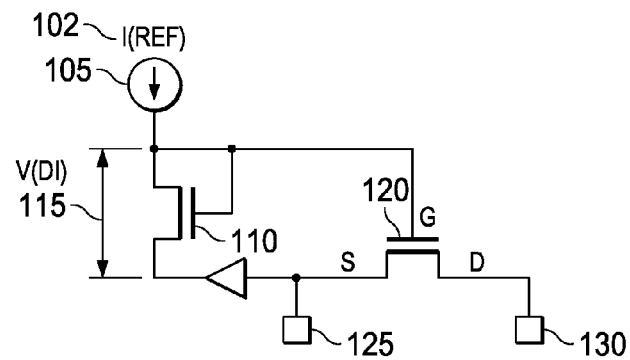
FIG. 1 is a prior-art circuit diagram of a MOS resistor.

FIG. 1 is a prior-art circuit diagram of a MOS resistor. A current I(REF) 102 is injected from a current source 105 into the current channel of a diode-connected MOS transistor 110. I(REF) is selected to create a bias voltage V(DI) 115 to bias the MOS transistor 120 to operate in the linear region. A MOS resistor is thus created between the source and drain terminals 125 and 130, respectively. Turning again to the equation for the MOS resistor:

$$R(DS) = \frac{1}{k\frac{W}{L}(V(GS) - V(TH) - V(DS)/2}$$

It can be seen that the resistance value retains a dependency upon the voltage V(DS) applied across the resistor terminals even as the gate voltage is held constant at V(DI).

Figure 2:
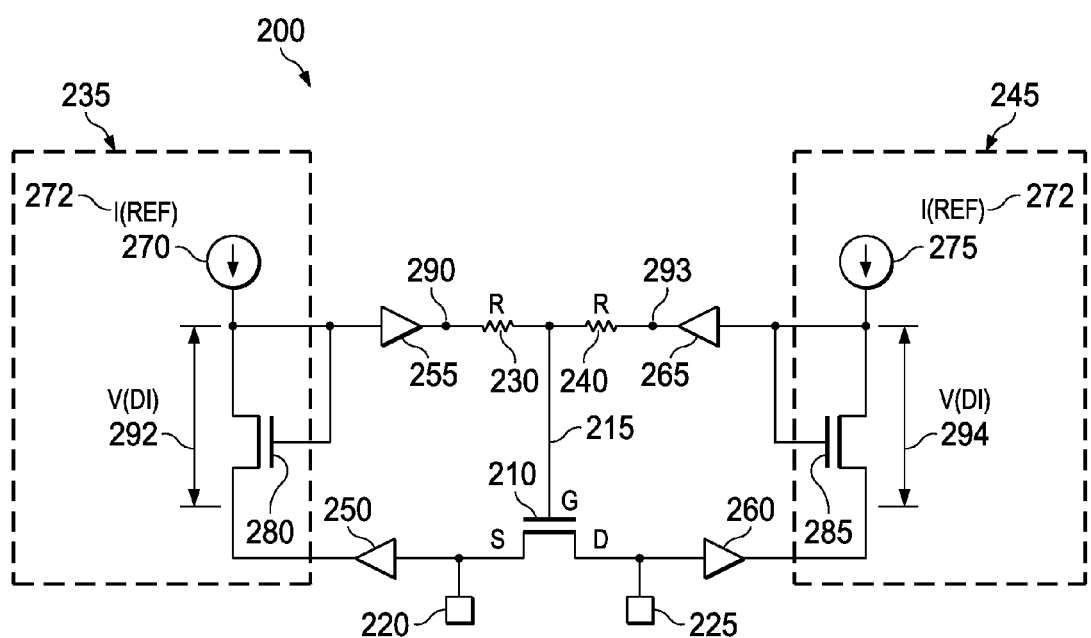
FIG. 2 is a circuit diagram of a MOS resistor according to various example aspects of the invention.

FIG. 2 is a circuit diagram of a MOS resistor 200 according to various example aspects of the invention. The MOS resistor 200 includes a MOS transistor 210 with a gate terminal 215. The MOS resistor 200 also includes two resistor terminals 220 and 225. One MOS resistor terminal is associated with the MOS transistor source and one MOS resistor terminal is associated with the MOS transistor drain. Although FIG. 2 shows an example configuration of source as the left-hand terminal and drain as the right-hand terminal, the MOS resistor 200 is symmetrical with respect to current flow between drain and source. Consequently, for the sake of generality, these apparatus will be described with reference to the symmetrical terminals of the MOS resistor 200 rather than referencing the MOS transistor drain and source terminals directly.

The MOS resistor 200 also includes a first compensation resistor 230 coupled to the MOS transistor gate terminal 215. The MOS resistor 200 further includes a first gate voltage bias source 235. The first gate voltage bias source 235 is communicatively coupled between the MOS resistor terminal 220 and the first compensation resistor 230.

The MOS resistor 200 also includes a second compensation resistor 240 coupled to the MOS transistor gate terminal 215. The MOS resistor 200 further includes a second gate voltage bias source 245. The second gate voltage bias source 245 is communicatively coupled between the MOS resistor terminal 225 and the second compensation resistor 240.

In some aspects, the MOS resistor 200 may include a number of voltage buffers. A buffer 250 may be coupled between the MOS resistor terminal 220 and the first gate voltage bias source 235. The buffer 250 isolates current flow associated with the first gate voltage bias source 235 from the MOS resistor terminal 220. A buffer 255 may be coupled between the first gate voltage bias source 235 and the first compensation resistor 230. The buffer 255 isolates current flow associated with first compensation resistor 230 from the first gate voltage bias source 235. A buffer 260 may be coupled between the MOS resistor terminal 225 and the second gate voltage bias source 245. The buffer 260 isolates current flow associated with the second gate voltage bias source 245 from the MOS resistor terminal 225. A buffer 265 may be coupled between the second gate voltage bias source 245 and the second compensation resistor 240. The buffer 265 isolates current flow associated with second compensation resistor 240 from the second gate voltage bias source 245.

In some aspects, the first gate voltage bias source 235 may include a first temperature and process compensated reference current source 270 to supply I(REF) 272. The first gate voltage bias source 235 may also include a first forward-biased diode 280 communicatively coupled between the first reference current source 270 and the MOS resistor terminal 220. Likewise, the second gate voltage bias source 245 may include a second reference current source 275 to supply I(REF) 272. The second gate voltage bias source 245 may also include a second forward-biased diode 285 communicatively coupled between the second reference current source 275 and the MOS resistor terminal 225. In some aspects, one or both of the first or second forward-biased diodes may be implemented using diode-connected MOS transistors as shown in the example of FIG. 2. The gate voltage bias sources described herein are example aspects. Other gate voltage bias sources, including resistor divider networks, bias voltages generated directly by digital-to-analog converters, etc. are contemplated in this disclosure.

Operation of the MOS resistor 200 may be described mathematically as follows. The voltage at node 290 is the sum of the MOS resistor terminal voltage V(T220) and the diode voltage drop V(DI) 292. Likewise, the voltage at node 293 is the sum of the MOS resistor terminal voltage V(T225) and the diode voltage drop V(DI) 294. With the compensation resistors 230 and 240 being equal, the average gate voltage is given by:

$$V(Gavg) = \frac{V(T220) + V(T225)}{2} + V(DI)$$

And the gate-to-MOS resistor terminal voltage V(GT) (also termed "V(GS)" in the context of the MOS transistor) is then:

$$V(GS) = \frac{V(T220) + V(T225)}{2} + V(DI) - V(T220)$$
$$= \frac{V(T225) - V(T220)}{2} + V(DI) = \frac{[V(DS)]}{2} + V(DI)$$

Substituting this expression of V(GS) into the MOS resistor equation yields:

$$R(DS) = \frac{1}{V(DS)/2 + V(DI) - V(TH) - V(DS)/2} = \frac{1}{V(DI) - V(TH)}$$

The resistance of the MOS resistor 200 is independent of V(DS), the voltage across the MOS resistor terminals as used in the drain/source polarity neutral discussion above. The MOS resistor 200 thus operates as a substantially constant value resistor within the linear operational region of the MOS transistor 210. The compensation resistors 230 and 240 operate synergistically with the MOS transistor linear region transfer characteristics to maintain linearity. Increases in voltage across the MOS resistor terminals are averaged by the equal compensation resistors 230 and 240. This averaged increase appears at the gate 215 and causes additional current I(D) to flow through the MOS resistor such as to maintain a constant V(DS) to I(D) ratio.

Figure 3:
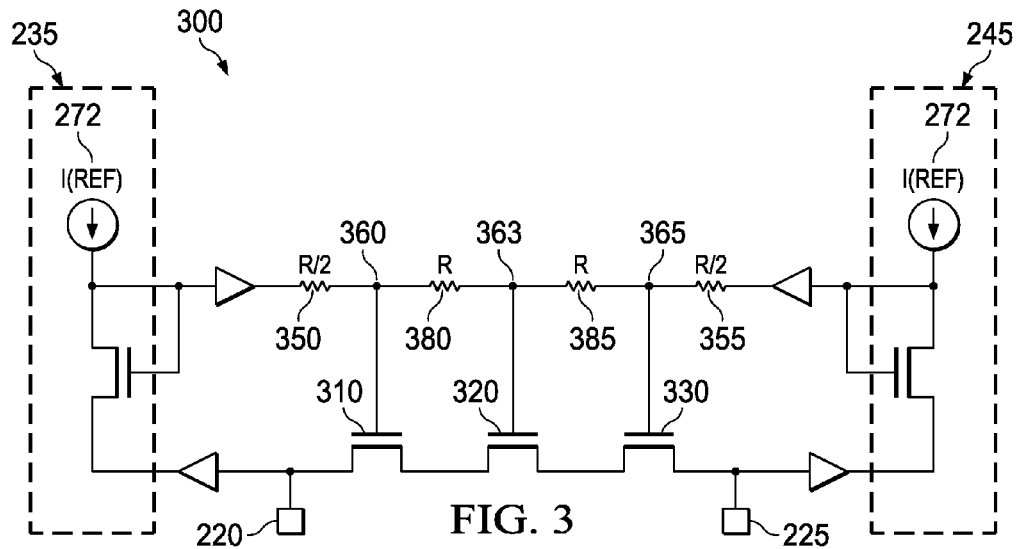
FIG. 3 is a circuit diagram of a multi-segmented MOS resistor according to various example aspects.

FIG. 3 is a circuit diagram of a multi-segmented MOS resistor 300 according to various example aspects. The MOS resistor 300 includes a cascaded plurality of a number of MOS transistors (e.g., the transistors 310, 320, and 330) connected in series between the resistor terminals 220 and 225. Each MOS transistor is coupled drain-to-source to the other MOS transistors of the cascaded plurality.

The MOS resistor 300 also includes compensation resistors 350 and 355 coupled to gate terminals 360 and 365, respectively, of the outermost MOS transistors 310 and 330 in the cascaded plurality. The MOS resistor 300 further includes gate voltage bias sources 235 and 245 as previously discussed with reference to FIG. 2. The bias source 235 is communicatively coupled between the MOS resistor terminal 220 and the compensation resistor 350. The bias source 245 is communicatively coupled between the MOS resistor terminal 225 and the compensation resistor 355.

The MOS resistor 300 also includes inter-gate compensation resistors 380 and 385. Each of the inter-gate compensation resistors 380 and 385 is coupled between a gate terminal of a MOS transistor and a gate terminal of a proximate MOS transistor in the cascaded plurality. (E.g., the inter-gate compensation resistor 380 is coupled between the gates 360 and 363, and the inter-gate compensation resistor 385 is coupled between the gates 363 and 365.) It is noted that the compensation resistor architecture of the MOS resistor 300 is fully equivalent to that of the MOS resistor 200. That is, two equal-valued resistors form of a voltage divider network at each gate. A compensation resistor R/2 (not shown) at the right of gate 360 is merged with a compensation resistor R/2 at the left of gate 363 to form R 380. Similarly, R 385 is formed by merging a resistor R/2 (not shown) from gate 363 with a resistor R/2 (not shown) from gate 365. The outermost resistors 350 and 355 are normalized to R/2.

The MOS resistor 300 may yield a larger resistance capable of operation with a greater dynamic range than that of the single transistor MOS resistor 200 of FIG. 2. The compensation resistors 350, 355, 380, and 385 of the MOS resistor 300 average voltage increases between the MOS resistor terminals 220 and 225 at the gates 360, 363, and 365 as described above with reference to FIG. 2. Such averaging results in an equalized increase in I(D) for each of the transistors 310, 320, and 330 such as to maintain a constant R(DS) of each of the transistors 310, 320, and 330. As a result, the overall resistance between the MOS resistor terminals 220 and 225 remains constant with voltage changes across the terminals.

Figure 4:
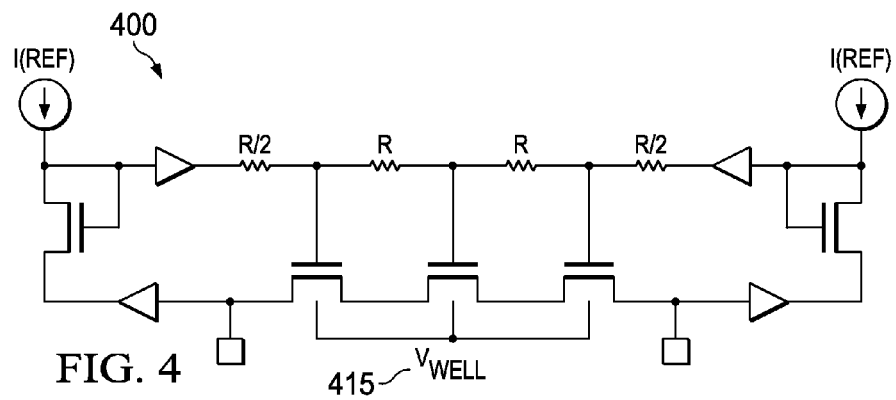
FIG. 4 is a circuit diagram of a multi-segmented MOS resistor with voltage wells to decrease leakage according to various example aspects.

FIG. 4 is a circuit diagram of a multi-segmented MOS resistor 400 with voltage wells to decrease leakage according to various example aspects. In very low current measurement applications, leakage from the MOS resistor current channel into the transistor bulk may become significant with higher terminal-to-bulk reverse biases. In some aspects, such leakage may be decreased by forming a V(WELL) 415 by minimizing the source-to-bulk reverse bias, the drain-to-bulk reverse bias, or both.

Some aspects may include electrically shorting the bulk and source terminals together to accomplish this objective. It is noted that such technique destroys the electrical symmetry between the MOS resistor terminals. Thus, in the case of an NMOS transistor, for example, the MOS resistor terminal shorted to the bulk would thereafter be treated as the low-voltage source terminal.

Figure 5:
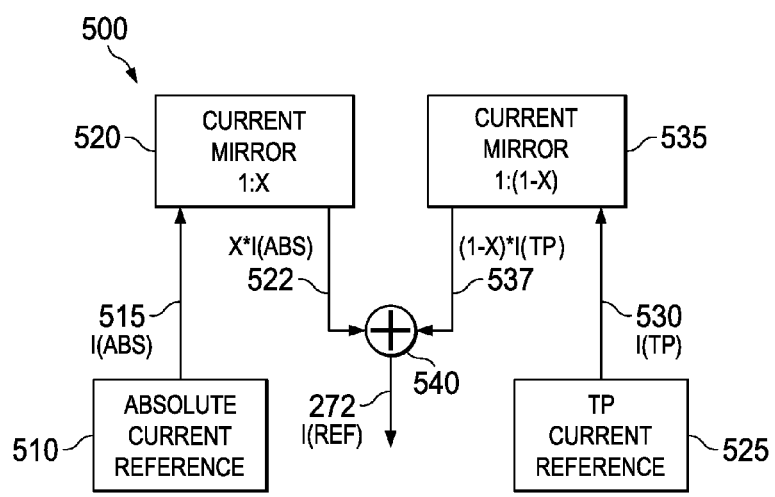
FIG. 5 is a block diagram of a MOS resistor temperature compensation reference current source according to various example aspects.

FIG. 5 is a block diagram of a MOS resistor temperature compensation reference current source 500 according to various example aspects. The reference current source 500 provides a component of bias current to compensate for temperature variations at the MOS resistor which might otherwise cause the resistance of the MOS resistor to vary. The reference current source 500 includes an absolute reference current source 510. The absolute reference current source 510 provides a reference current I(ABS) 515 that is substantially invariant with temperature. The temperature compensation reference current source 500 also includes a first current mirror 520 coupled to the absolute reference current source 510. The first current mirror 520 factors I(ABS) 515 by a mixing factor X to obtain a factor I(ABS) 522.

The temperature compensation reference current source 500 further includes a temperature proportional reference current source 525. The temperature proportional reference current source 525 provides a reference current I(TP) 530. The current I(TP) 530 is linearly proportional to an operating temperature associated with the MOS resistors 200 and 300 of FIG. 2 and FIG. 3, respectively. The temperature compensation reference current source 500 also includes a second current mirror 535 coupled to the temperature proportional reference current source 525. The second current mirror 535 factors I(TP) 530 by a factor (1−X) to obtain a factored I(TP) 537.

The temperature compensation reference current source 500 further includes a summing junction 540 coupled to the first and second current mirrors 520 and 535. The summing junction 540 combines the factored I(ABS) 522 and the factored I(TP) 537 to obtain the bias reference current I(REF) 272 described above with reference to FIGS. 2 and 3. The mixing factor X is selected to produce substantial temperature stability of the resistance of the MOS resistors 200 and 300. It is noted that in some aspects, I(TP) 530 is selected to be substantially equal to I(ABS) 515 at a nominal operating temperature of the MOS resistor. Normalizing the reference currents I(ABS) 515 and I(TP) 530 at a nominal operating temperature results in a mixing factor X falling roughly in the middle of the range 1 to −1. Some aspects may utilize a mixing factor X in the range of −0.4 to −0.6.

Figure 6:
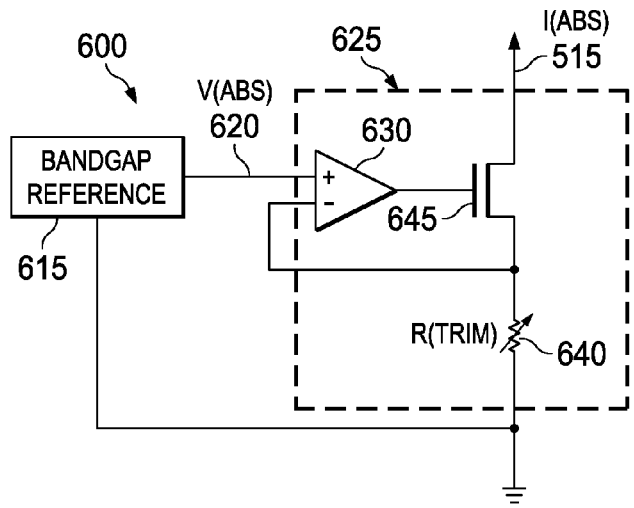
FIG. 6 is a schematic diagram of an absolute reference current source according to various example aspects.

FIG. 6 is a schematic diagram of an absolute reference current source 600 (e.g., the absolute current reference 510 of FIG. 5) according to various example aspects. The absolute reference current source 600 includes a bandgap reference voltage source 615 as is known in the art. The bandgap reference voltage source 615 provides a reference voltage V(ABS) 620 that is substantially invariant with temperature.

The absolute reference current source 600 also includes a transconductance amplifier 625 communicatively coupled to the bandgap reference voltage source 615. The transconductance amplifier 625 converts V(ABS) 620 to the temperature invariant reference current I(ABS) 515 as discussed above with reference to FIG. 5. The transconductance amplifier 625 includes an operational amplifier 630 to control I(ABS) 515 through transistor 645. The transconductance amplifier 625 also includes trimmable resistance apparatus R(TRIM) 640 communicatively coupled to the operational amplifier 630 to provide negative feedback. R(TRIM) 640 is trimmed following die fabrication to adjust I(ABS) 515 for semiconductor process variations. Consequently, I(ABS) 515 is generated as a substantially temperature and process independent reference current.

Figure 7:
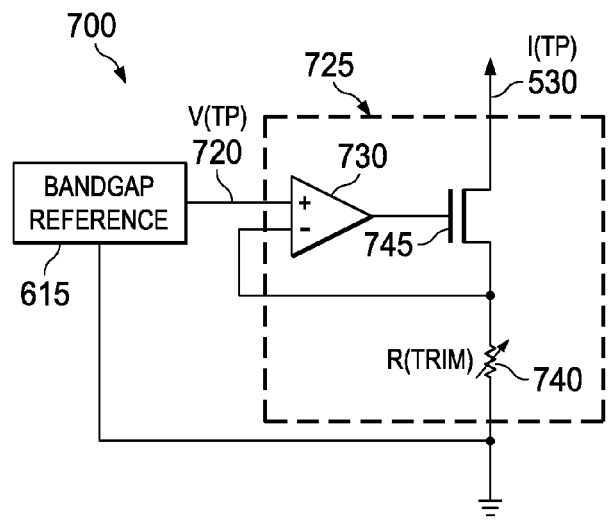
FIG. 7 is a schematic diagram of a temperature proportional reference current source according to various example aspects.

FIG. 7 is a schematic diagram of a temperature-proportional (TP) reference current source 700 (e.g., the TP current reference 525 of FIG. 5) according to various example aspects. The TP reference current source 700 includes the bandgap reference voltage source 615. The bandgap reference voltage source 615 provides a reference voltage V(TP) 720 that is substantially linearly proportional to the MOS resistor operating temperature.

The TP reference current source 700 also includes a transconductance amplifier 725 communicatively coupled to the bandgap reference voltage source 615. The transconductance amplifier 725 converts the reference voltage V(TP) 720 to a reference current I(TP) 530 that is also substantially linearly proportional to the MOS resistor operating temperature. The transconductance amplifier 725 includes an operational amplifier 730 to control I(TP) 530 through transistor 745. The transconductance amplifier 725 also includes trimmable resistance apparatus R(TRIM) 740 communicatively coupled to the operational amplifier 730 to provide negative feedback. R(TRIM) 740 may be trimmed following die fabrication to normalize I(TP) 530 to I(ABS) 515 at a selected nominal operating temperature after taking into account semiconductor process variations. Consequently, I(TP) 530 varies in a substantially linear proportion to the MOS resistor operating temperature, is substantially process independent, and may in some aspects be normalized to I(ABS) at a selected nominal operating temperature (e.g., 70° C.).

Figure 8:
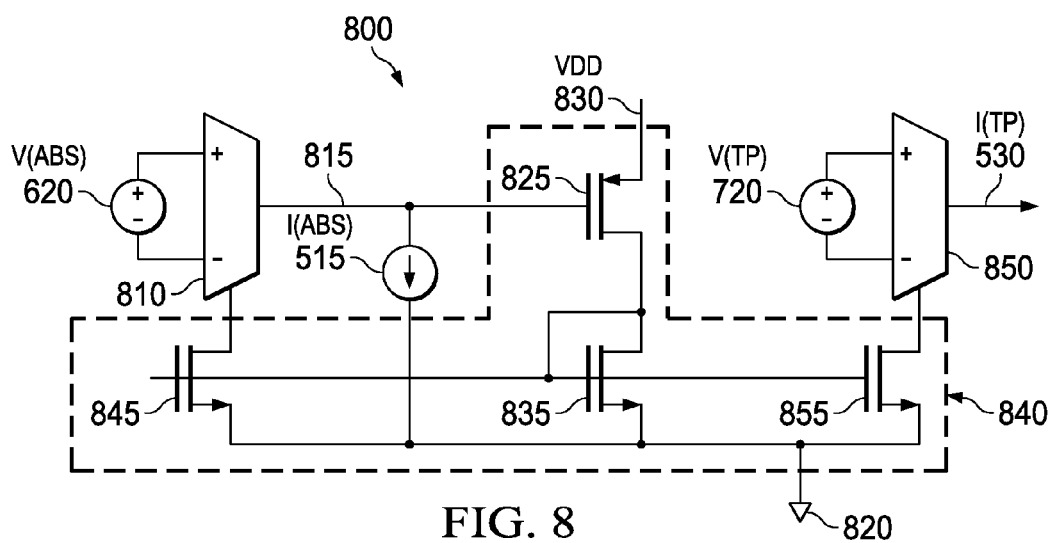
FIG. 8 is a schematic diagram of a temperature proportional reference current source according to various example aspects.

FIG. 8 is a schematic diagram of an alternate embodiment TP reference current source 800 according to various example aspects. The TP reference current source 800 operates as a transconductance amplifier to produce a temperature-proportional reference current I(TP) 530 as does the transconductance amplifier 725 of FIG. 7. However, the IP reference current source 800 trims for process variations by using the pre-trimmed I(ABS) 515 to bias a current mirror 840 which controls the gain of transconductance amplifier 850 as follows.

The TP reference current source 800 includes a first matched transconductance amplifier 810 with an input equal to the bandgap reference voltage V(ABS) 620. The TP reference current source 800 also includes a process-adjusted temperature invariant current source I(ABS) 515 coupled between an output of the first matched transconductance amplifier 810 and ground 820.

The TP reference current source 800 further includes a PMOS transistor 825. The PMOS transistor 825 is gate-connected to the output 815 of the first matched transconductance amplifier 810. The current channel of the PMOS transistor 825 is coupled between V(DD) 830 and an NMOS transistor 835 operating as a first stage of the current mirror 840. The reference current I(ABS) 515 and the PMOS transistor 825 create a reference current for the current mirror 840.

The TP reference current source 800 also includes a first NMOS transistor 845 communicatively coupled to the first matched transconductance amplifier 810. The first NMOS transistor 845 operates as a second stage of the current mirror 840 and provides a gm control current to the first matched transconductance amplifier 810.

The TP reference current source 800 further includes a second matched transconductance amplifier 850 with an input equal to the bandgap reference voltage V(TP) 720. The second matched transconductance amplifier 850 is communicatively coupled to a second NMOS transistor 855. The second NMOS transistor 855 operates as a second stage of the current mirror 840 to provide a gm control current to the second matched transconductance amplifier 850. The TP reference current source 800 produces the temperature proportional current I(TP) 530 without having to resistor-trim to compensate for process variations. Such compensation is already included in the reference current I(ABS) 515.

It is noted that FIGS. 5, 6, 7, and 8 illustrate modalities for compensating the MOS resistors 200 and 300 to maintain a substantially constant MOS resistance with temperature variances at the MOS resistor. Conceptually, these embodiments sense temperature changes and apply feedback as gate voltage adjustments to the MOS resistor. Equivalent modalities for accomplishing such resistance-stabilizing objectives are contemplated by this disclosure.

Figure 9B:
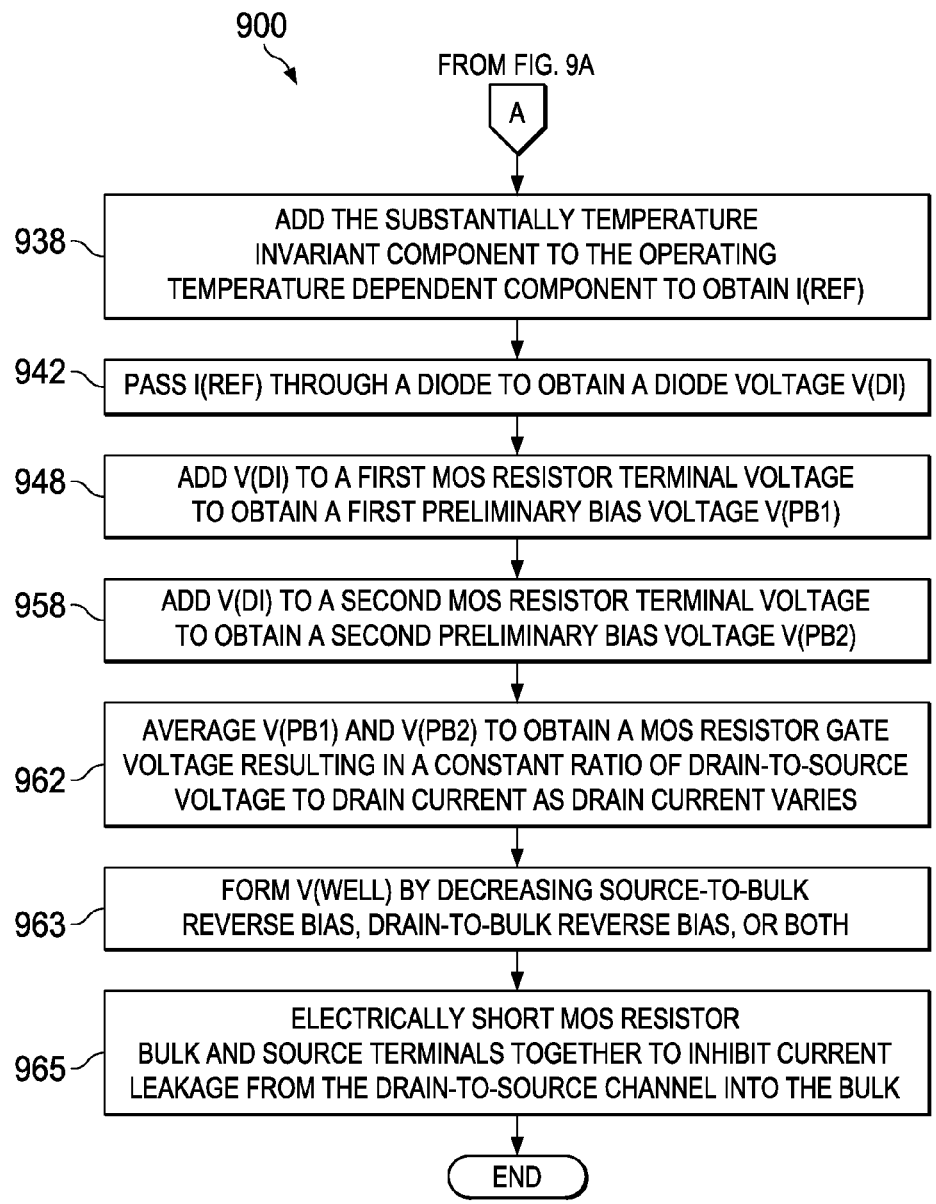

FIGS. 9A and 9B are a flow diagram illustrating a method 900 of maintaining a substantially constant ratio of terminal voltage to current through a MOS resistor formed by at least one MOS transistor drain-to-source channel according to various activities.

The method 900 includes averaging gate-to-terminal voltages associated with each terminal of the MOS resistor to obtain an average gate voltage for the MOS transistor(s). If the voltage across the MOS resistor terminals varies, a new average gate voltage is applied to the gate(s) of the MOS transistor(s) to drive correspondingly more or less current through the MOS current channel to maintain a constant terminal voltage to current ratio.

The method 900 commences at block 904 with converting a bandgap reference source-derived reference voltage V(ABS) to a first reference current. V(ABS) and the first reference current are substantially invariant with temperature. The method 900 continues with trimming the first reference current to remove process-to-process variances to obtain a substantially temperature and process independent reference current I(ABS), at block 910.

The method 900 also includes converting a bandgap reference source-derived reference voltage V(TP) to a second reference current V(TP), at block 913. The second reference current is substantially linearly proportional to an operating temperature associated with the MOS resistor. The method 900 further includes trimming the second reference current to remove process-to-process variances and to normalize the second reference current to I(ABS) at a selected nominal operating temperature, at block 918. A substantially process independent reference current I(TP) that is substantially proportional to the operating temperature of the MOS resistor and that is substantially normalized to I(ABS) at the selected nominal operating temperature is obtained.

The method 900 proceeds at block 923 with selecting a combinatorial factor X. The method 900 continues with multiplying I(ABS) by X to obtain a substantially temperature invariant component of the reference current I(REF), at block 928. The method 500 also includes multiplying I(TP) by (1−X) to obtain an operating temperature dependent component of the reference current I(REF), at block 933. The method 900 further includes adding the substantially temperature invariant component of reference current to the operating temperature dependent component to obtain the reference current I(REF), at block 938.

The method 900 proceeds at block 942 with passing the reference current I(REF) through a diode to obtain a diode voltage V(DI). The method 900 continues with adding V(DI) to a first MOS resistor terminal voltage to obtain a first preliminary bias voltage V(PB1), at block 948. The method 900 also includes adding V(DI) to a second MOS resistor terminal voltage to obtain a second preliminary bias voltage V(PB2), at block 958. The method 900 further includes averaging V(PB1) and V(PB2) to obtain a MOS resistor gate voltage resulting in a constant ratio of MOS resistor terminal voltage to MOS resistor current, at block 962.

Some variations of the method 900 may include compensating for reverse diode current channel to bulk current leakage in the MOS resistor. The method 900 may include forming a V(WELL) by decreasing the source-to-bulk reverse bias, the drain-to-bulk reverse bias, or both, at block 963. Some variations of the method 900 may include electrically shorting the bulk and source terminals together, at block 965.

Modules and components described herein may include hardware circuitry, optical components, single or multi-processor circuits, and/or memory circuits. Subject matter of the instant disclosure may also include combinations of described modules and components, as desired by the architects of the MOS resistors 200, 300, and 400, the method 900, and as appropriate for particular implementations of various aspects.

Systems and methods described herein may be useful in applications other than implementation of a substantially temperature and process invariant MOS resistor. Examples of the MOS resistors 200, 300, and 400 and the method 900 are intended to provide a general understanding of the structures of various aspects and the flow of various sequences. They are not intended to serve as complete descriptions of all elements and features of apparatus and systems that might make use of these structures and sequences.

The various aspects may be incorporated into semiconductor analog and digital circuits for incorporation into receptacle power converters, electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Apparatus and methods disclosed herein implement a MOS resistor using the current channel of a MOS transistor. The MOS resistance R(DS) is dependent upon MOS transistor geometry and nominal gate voltage. MOS resistor terminal-to-gate voltages are averaged and applied to the MOS transistor gate such as to maintain the MOS resistor terminal voltage to current ratio, resulting in a substantially constant R(DS). R(DS) is also compensated for temperature and process variations by adjusting the voltage via a negative feedback loop. New and unexpected results from this emergent technology include an approximately 30-fold decrease in die area occupied by a MOS resistor of 50 Meg ohms. The MOS resistor occupies approximately 35,000 square microns compared to an area of approximately 1,000,000 square microns occupied by a 50 Meg ohm polysilicon resistor.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Such aspects of the inventive subject matter may be referred to herein individually or collectively by the term "invention" merely for convenience and without intending to voluntarily limit this application to any single invention or inventive concept, if more than one is in fact disclosed. Thus, although specific aspects have been illustrated and described herein, any arrangement calculated to achieve the same purpose may be substituted for the specific aspects shown. This disclosure is intended to cover any and all adaptations or variations of various aspects.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A metal oxide semiconductor (MOS) resistor, comprising:
   a MOS transistor with a gate terminal;
   two MOS resistor terminals, one associated with the MOS transistor source and one associated with the MOS transistor drain;
   first and second compensation resistors coupled to the MOS transistor gate terminal;
   a first gate voltage bias source communicatively coupled between a first one of the MOS resistor terminals and the first compensation resistor; and
   a second gate voltage bias source communicatively coupled between a second one of the MOS resistor terminals and the second compensation resistor,
   the first gate voltage bias source further comprising:
      a first reference current source; and
         a first forward-biased diode communicatively coupled between the first reference current source and the first MOS resistor terminal.

2. The MOS resistor of claim 1, further comprising:
   a buffer coupled between the first MOS resistor terminal and the first gate voltage bias source to isolate current flow associated with the first gate voltage bias source from the first MOS resistor terminal.

3. The MOS resistor of claim 1, further comprising:
   a buffer coupled between the first gate voltage bias source and the first compensation resistor to isolate current flow associated with first compensation resistor from the first gate voltage bias source.

4. The MOS resistor of claim 1, further comprising:
   a buffer coupled between the second MOS resistor terminal and the second gate voltage bias source to isolate current flow associated with the second gate voltage bias source from the second MOS resistor terminal.

5. The MOS resistor of claim 1, further comprising:
   a buffer coupled between the second gate voltage bias source and the second compensation resistor to isolate current flow associated with second compensation resistor from the second gate voltage bias source.

6. The MOS resistor of claim 1, the second gate voltage bias source further comprising:
   a second reference current source; and
   a second forward-biased diode communicatively coupled between the second reference current source and the second MOS resistor terminal.

7. The MOS resistor of claim 6, at least one of the first or second forward-biased diodes comprising a diode-connected MOS transistor.

8. A metal oxide semiconductor (MOS) resistor, comprising:
   a cascaded plurality of MOS transistors, each MOS transistor coupled drain-to-source to the other MOS transistors of the cascaded plurality;
   an inter-gate compensation resistor coupled between a gate terminal of each MOS transistor and a gate terminal of a next MOS transistor in the cascaded plurality;
   two outermost compensation resistors, one outermost compensation resistor coupled to a gate terminal associated with each one of an outermost MOS transistor in the cascaded plurality; and
   two gate voltage bias sources, each gate voltage bias source communicatively coupled between a terminal of the MOS resistor and a most proximate one of the outermost compensation resistors,
   an absolute reference current source to provide a reference current I(ABS) substantially invariant with temperature;
   a first current mirror coupled to the absolute reference current source to factor I(ABS) by a factor X;
   a temperature proportional reference current source to provide a reference current I(TP) linearly proportional to an operating temperature associated with the MOS resistor;
   a second current mirror coupled to the temperature proportional reference current source to factor I(TP) by a factor (1−X); and
   a summing junction coupled to the first and second current mirrors to combine the factored I(ABS) and the factored I(TP) to obtain a bias reference current I(REF).

9. The MOS resistor of claim 8, I(TP) selected to be substantially equal to I(REF) at a nominal operating temperature of the MOS resistor.

10. The MOS resistor of claim 8, an operational value of the factor X selected as approximately −0.4 to −0.6.

11. The MOS resistor of claim 8, the absolute reference current source further comprising:
   a bandgap reference voltage source to provide a reference voltage V(ABS) substantially invariant with temperature;
   an operational amplifier communicatively coupled to the bandgap reference voltage source to receive V(ABS);
   a transistor gate-coupled to the operational amplifier to produce I(ABS) as a function of V(ABS); and
   a trimmable resistance apparatus R(TRIM) coupled to the operational amplifier to provide negative feedback to adjust I(ABS) for semiconductor process variations.

12. The MOS resistor of claim 11, the temperature proportional reference current source further comprising:
   a first matched transconductance amplifier with an input equal to V(ABS);
   process-adjusted temperature invariant current source I(ABS) coupled between an output of the first matched transconductance amplifier and ground;
   a PMOS transistor gate-connected to the output of the first matched transconductance amplifier and current channel coupled between V(DD) and an NMOS transistor operating as a first stage of a current mirror, the PMOS transistor to operate as a reference current for the current mirror;
   a first NMOS transistor operating as a second stage of the current mirror, the first NMOS transistor coupled to the first matched transconductance amplifier as a control current source;
   a second matched transconductance amplifier with an input equal to V(TP); and
   a second NMOS transistor operating as a second stage of the current mirror, the second NMOS transistor coupled to a second matched transconductance amplifier as a control current source such as to produce a temperature proportional current I(TP) corrected for process variations by I(ABS).

13. The MOS resistor of claim 8, the temperature proportional reference current source further comprising:
   a bandgap reference voltage source to provide a reference voltage V(TP) substantially linearly proportional to the MOS resistor operating temperature;
   an operational amplifier communicatively coupled to the bandgap reference voltage source to receive V(TP);
   a transistor gate-coupled to the operational amplifier to produce I(TP) as a function of V(TP); and
   a trimmable resistance apparatus R(TRIM) coupled to the operational amplifier to provide negative feedback to adjust I(TP) for semiconductor process variations.

14. A method of maintaining a substantially constant ratio of terminal voltage to current through a metal oxide semiconductor (MOS) resistor formed by at least one MOS transistor drain-to-source channel, comprising:
   averaging gate-to-terminal voltages associated with each terminal of the MOS resistor to obtain an average gate voltage for the MOS transistor(s); and
   applying the average gate voltage to the gate(s) of the MOS transistor(s),
   passing a reference current I(REF) through a diode to obtain a diode voltage V(DI);
   adding V(DI) to a first MOS resistor terminal voltage to obtain a first preliminary bias voltage V(PB1);
   adding V(DI) to a second MOS resistor terminal voltage to obtain a second preliminary bias voltage V(PB2); and
   averaging V(PB1) and V(PB2) to obtain a MOS resistor gate voltage resulting in a constant ratio of MOS resistor terminal voltage to MOS resistor current.

15. The method of claim 14, compensation for MOS resistor variance with temperature and process variations further comprising:
   converting a bandgap reference source-derived reference voltage V(ABS) to a first reference current, V(ABS) and the first reference current substantially invariant with temperature;
   tuning the first reference current to remove process-to-process variances to obtain a substantially temperature and process independent reference current I(ABS);
   converting a bandgap reference source-derived reference voltage V(TP) to a second reference current, V(TP) and the second reference current substantially linearly proportional to an operating temperature associated with the MOS resistor; and
   tuning the second reference current to remove process-to-process variances and to normalize the second reference current to I(ABS) at a selected nominal operating temperature to obtain a substantially process independent reference current I(TP) that is substantially proportional to the operating temperature of the MOS resistor and that is substantially normalized to I(ABS) at the selected nominal operating temperature.

16. The method of claim 15, compensation for MOS resistor variance with temperature and process variations further comprising:
   selecting a combinatorial factor X;
   multiplying I(ABS) by X to obtain a substantially temperature invariant component of the reference current I(REF);
   multiplying I(TP) by (1−X) to obtain an operating temperature dependent component of the reference current I(REF); and
   adding the substantially temperature invariant component to the operating temperature dependent component to obtain I(REF).

17. The method of claim 14, compensation for reverse diode current channel to bulk current leakage in the MOS transistor comprising at least one of:
   forming a V(WELL) by minimizing at least one of the source-to-bulk reverse bias or the drain-to-bulk reverse bias;
   electrically shorting the bulk and source terminals together in the case of an NMOS transistor; or
   electrically shorting the bulk and drain terminals together in the case of a PMOS transistor.

* * * * *